(12) United States Patent
Shimizu et al.

(10) Patent No.: US 7,432,172 B2
(45) Date of Patent: Oct. 7, 2008

(54) PLASMA ETCHING METHOD

(75) Inventors: Akitaka Shimizu, Yamanashi (JP);
Hiromi Oka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 11/335,662

(22) Filed: Jan. 20, 2006

(65) Prior Publication Data

US 2006/0163202 A1 Jul. 27, 2006

Related U.S. Application Data

(60) Provisional application No. 60/650,962, filed on Feb. 9, 2005.

(30) Foreign Application Priority Data

Jan. 21, 2005 (JP) ............................. 2005-013911

(51) Int. Cl.
*H01L 21/76* (2006.01)
*H01L 21/311* (2006.01)
(52) U.S. Cl. ..................... 438/424; 438/425; 438/426; 438/696; 438/700
(58) Field of Classification Search .................. None
See application file for complete search history.

(56) References Cited

U.S. PATENT DOCUMENTS

| 5,674,775 | A | * | 10/1997 | Ho et al. | ..................... 438/296 |
| 5,753,561 | A | * | 5/1998 | Lee et al. | ..................... 438/424 |
| 5,807,789 | A | * | 9/1998 | Chen et al. | ................... 438/714 |
| 5,945,724 | A | * | 8/1999 | Parekh et al. | ................ 257/510 |
| 6,153,478 | A | * | 11/2000 | Lin et al. | ..................... 438/296 |
| 6,174,786 | B1 | * | 1/2001 | Kelley et al. | ................ 438/425 |
| 2003/0148224 | A1 | * | 8/2003 | Vahedi et al. | ................ 430/314 |

* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

A plasma etching method for etching an object to be processed, which has at least an etching target layer and a patterned mask layer formed on the etching target layer, to form a recess corresponding to a pattern of the mask layer in the etching target layer, includes a first plasma process of forming deposits on the etching target layer at least around a boundary between the etching target layer and the mask layer in an opening portion constituting the pattern of the mask layer, and a second plasma process of forming the recess by etching the etching target layer after the first plasma process. An edge portion of an upper sidewall constituting the recess is rounded off in the second plasma process.

14 Claims, 3 Drawing Sheets

FIRST PLASMA PROCESS

SECOND PLASMA PROCESS

PLASMA ETCHING METHOD

CROSS-REFERENCE TO RELATED APPLICATIONS

This document claims priority to Japanese Patent Application Number 2005-13911, filed Jan. 21, 2005 and U.S. Provisional Application No. 60/650,962, filed Feb. 9, 2005, the entire content of which are hereby incorporated by reference.

FIELD OF THE INVENTION

The present invention relates to a plasma etching method; and, more particularly, to a plasma etching method applicable to, e.g., trench formation in a shallow trench isolation (STI) that is a device isolation technique in a manufacturing process of a semiconductor device.

BACKGROUND OF THE INVENTION

An STI has been known as a technique for electrically isolating a device formed on a silicon substrate. The STI involves the sequential steps of etching a silicon substrate through a mask of, for example, a silicon nitride film to form a trench therein; filling the trench with an insulating film such as $SiO_2$; and planarizing the substrate by chemical mechanical polishing (CMP) by way of using the mask (silicon nitride film) as a stopper.

However, recently, with the trend of requirement for high integration and high speed of LSI (large scale integrated circuit), a design rule of semiconductor devices forming the LSI is getting finer and, at the same time, economization of power consumption is increasingly required. In case of forming a fine trench in the STI, a shoulder portion of the trench (an edge portion of an upper sidewall in the trench) formed by an etching tends to have an acute angle. As a result, a leakage current between a gate electrode and an active area through the shoulder portion increases, thereby causing a problem that power consumption becomes increased.

Thus, there is proposed an etching method including a first step of introducing a gaseous mixture containing HBr and $N_2$ serving as a processing gas and rounding off an upper sidewall of a trench by plasma processing; a second step of making a trench in a silicon of the silicon substrate by plasma processing; and a third step of introducing a gaseous mixture containing HBr and $Cl_2$ serving as a processing gas and rounding a bottom portion of the trench by plasma processing (see, e.g., Reference 1).

[Reference 1] Japanese Patent Laid-open Application No. 2003-218093

The etching method disclosed in Reference 1 is an excellent technique capable of forming a round shape (top rounding) in the shoulder portion of the trench by performing the first step to thereby reduce the leakage current. Since, however, it is a multi-step plasma etching method involving the first step of forming a shallow trench by plasma etching the silicon substrate, the second step and the third step, a shoulder of a mask may be damaged due to a prolonged etching time and, thus, a further improvement is required to enhance an accuracy of microprocessing. Further, in the method disclosed in Reference 1, since a temperature of the substrate (a temperature of a lower electrode) needs to be changed in order to accurately round the shoulder portion in the first and the second step, a time for adjusting the temperature is needed and, thus, the time required for sequential steps tends to be longer. Accordingly, a process capable of further improving a throughput is requested.

SUMMARY OF THE INVENTION

It is, therefore, an object of the present invention to provide an etching method capable of quickly performing a process while accurately rounding a shoulder portion of a trench formed in a silicon substrate.

In order to achieve the object, in accordance with a first aspect of the present invention, there is provided a plasma etching method for etching an object to be processed, which includes at least an etching target layer and a patterned mask layer formed on the etching target layer, to form a recess corresponding to a pattern of the mask layer in the etching target layer, including a first plasma process of forming deposits on the etching target layer at least around a boundary between the etching target layer and the mask layer in an opening portion constituting the pattern of the mask layer; and a second plasma process of forming the recess by etching the etching target layer after the first plasma process, wherein an edge portion of an upper sidewall constituting the recess is rounded off in the second plasma process.

In the plasma etching method of the first aspect, preferably, a processing gas of the first plasma process contains hydrofluorocarbon, more preferably, $CHF_3$, $CH_2F_2$ or $CH_3F$.

Further, preferably, a processing gas of the second plasma process is a halogen-based gas and, more preferably, the halogen-based gas contains at least one of HBr and $Cl_2$.

Further, preferably, a processing time of the first plasma process is equal to or greater than 3 seconds and equal to or less than 60 seconds.

Further, preferably, a radius of curvature of the edge portion of the upper sidewall constituting the recess is controlled by the processing time of the first plasma process and an angle of the sidewall constituting the recess is controlled by a processing temperature of the second plasma process.

Further, preferably, a radius of curvature of the edge portion of the upper sidewall constituting the recess is controlled by mixing the processing gas of the first plasma process with an etching gas.

The plasma etching method of the first aspect is preferably applied to a trench etching in a shallow trench isolation.

In accordance with a second aspect of the present invention, there is provided a plasma etching method for etching an object to be processed, which includes at least a silicon substrate, a silicon oxide film formed on the silicon substrate and a silicon nitride film formed on the silicon oxide film, wherein the silicon oxide film and the silicon nitride film serve as a mask layer and are patterned to form an opening portion and the object is etched to form a trench corresponding to a pattern of the mask layer in the silicon substrate, the method including a first plasma process of forming deposits on the silicon substrate at least around a boundary between the silicon substrate and the mask layer in the opening portion constituting the pattern of the mask layer by using a plasma of a first processing gas containing C, F and H; and a second plasma process of forming the trench by etching the silicon substrate by using a plasma of a second processing gas after the first plasma process, wherein an edge portion of an upper sidewall constituting the trench is rounded off in the second plasma process.

In accordance with a third aspect of the present invention, there is provided a plasma etching apparatus, including a plasma supply source for generating a plasma; a processing chamber for performing an etching process on an object to be processed by using the plasma; a supporter for mounting the object thereon in the processing chamber; a gas exhaust unit for depressurizing the processing chamber; a gas supply unit for supplying a gas into the processing chamber; and a controller for controlling the plasma etching apparatus to perform the plasma etching method of the first or the second aspect.

In accordance with a fourth aspect of the present invention, there is provided a control program executable on a computer for controlling a plasma processing apparatus to perform the plasma etching method of the first or the second aspect.

In accordance with a fifth aspect of the present invention, there is provided a computer storage medium for storing therein a control program executable on a computer, wherein the control program is executed to control a plasma processing apparatus for performing the plasma etching method of the first or the second aspect.

In accordance with the present invention, the deposits formed by the first plasma process suppress etching of the etching target layer such as the silicon substrate around the sidewall of the opening portion (around a boundary between the etching target layer and the mask layer), whereby the shoulder portion of the recess can be rounded off. Further, the rounding degree (radius of curvature) of the shoulder portion can be simply controlled by the processing time of the first plasma process. Thus, in the trench forming in the STI or the like, a recess having its shoulder portion rounded off can be accurately formed with a high throughput. In a semiconductor device wherein a recess in a device isolation region is formed by using the etching method, a leakage current between the gate electrode and the active area is suppressed, thereby realizing economization of power consumption.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1A:
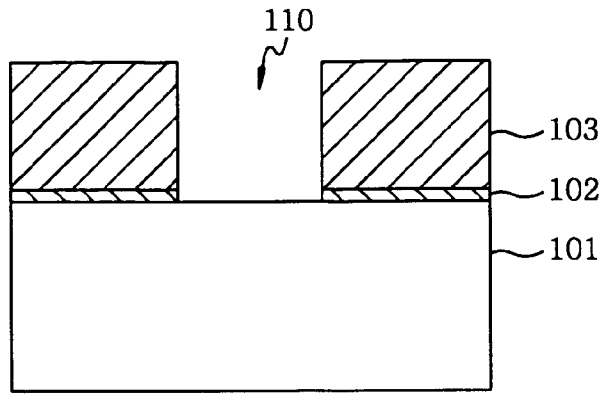
FIGS. 1A to 1C schematically show longitudinal cross sectional views of a wafer in accordance with a preferred embodiment of the present invention.
Figure 1B:
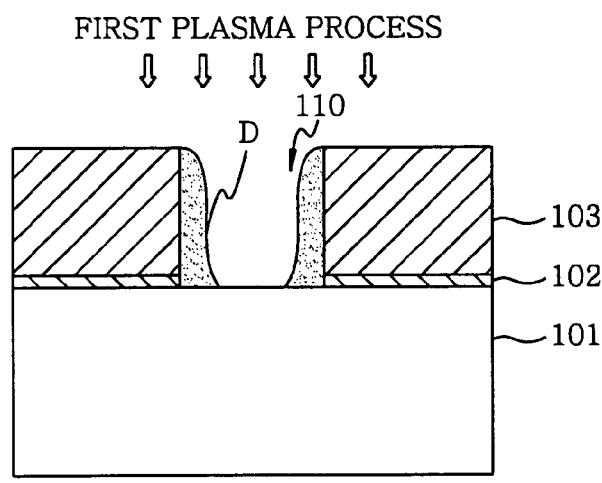
Figure 1C:
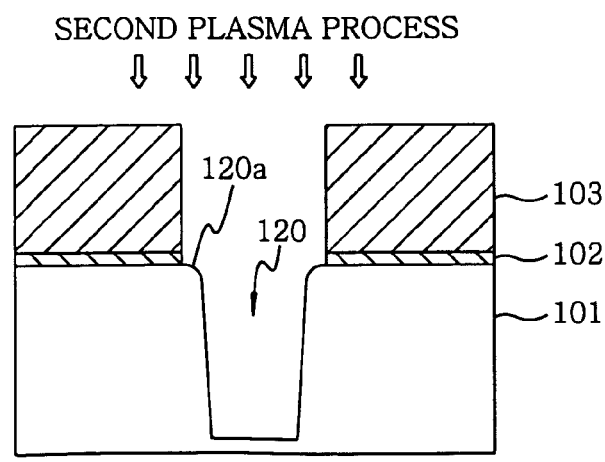

FIGS. 1A to 1C schematically show enlarged longitudinal cross sectional views of principal parts of a semiconductor wafer W (hereinafter, simply referred to as "wafer") in a silicon trench etching process in the STI or the like to explain the preferred embodiment of the present invention. As shown in FIG. 1A, the wafer W includes a silicon substrate 101; a silicon oxide film 102 such as $SiO_2$ formed on the silicon substrate 101; and a silicon nitride film 103 such as $Si_3N_4$ formed on the silicon oxide film 102. The silicon nitride film 103 serves as a hard mask.

The silicon nitride film 103 and the silicon oxide film 102 are patterned after a predetermined shape, and form a mask layer. FIG. 1A shows a groove portion 110 serving as an opening portion of a pattern. Further, a process of patterning the silicon nitride film 103 and the silicon oxide film 102 can be performed by etching them through a mask of a resist pattern formed by photolithography, although it is not shown in the drawing.

FIG. 1B shows a state after a first plasma process is performed. In the first plasma process, deposits D are formed on an etching target layer at least around a sidewall of the groove portion 110. In other words, the deposits D are formed on an exposed surface of the silicon substrate 101 around a boundary between the silicon substrate 101 serving as the etching target layer and the mask layer (in this embodiment, the silicon nitride film 103 and the silicon oxide film 102).

A gas capable of forming the deposits D can be employed as a processing gas of the first plasma process and, for instance, a processing gas containing at least C, F and H, preferably, a gas containing hydrofluorocarbon such as $CHF_3$, $CH_2F_2$ and $CH_3F$ can be used. Since hydrofluorocarbon produces a polymer in the first plasma process, the deposits D are formed on the wafer W. At this time, in the first plasma process, it is preferable to make ion components in the plasma incident on the wafer W by a bias voltage generated by applying a high frequency power to the lower electrode in, for example, an electrical power applied upper and lower electrode plasma etching apparatus (see FIG. 3). Accordingly, the deposits D are thickly formed on a peripheral bottom surface of the groove portion 110 where the silicon substrate 101 is exposed, which is close to a boundary between the silicon substrate 101 and the mask layer, whereas the deposits are rarely formed on a central bottom surface of the groove portion 110.

A gaseous mixture containing, for example, hydrofluorocarbon, and a nonreactive gas such as a rare gas (e.g., Ar, He, Xe and Kr) and $N_2$ can be used as the processing gas of the first plasma process.

Further, the processing gas of the first plasma process can be mingled with an etching gas, e.g., $CF_4$, $O_2$, $SF_6$ and $NF_3$. The processing gas may have a function of removing the formed deposits D by mixing the processing gas and the etching gas at a specified ratio, thereby controlling a deposit rate of the deposits D. That is, when the processing gas which is mixed with the etching gas is used, it becomes easier to control the deposit rate than when a gas which intensively makes deposits, e.g., hydrofluorocarbon, is solely used.

Next, as shown in FIG. 1C, there is performed a second plasma process for etching the silicon substrate 101 through a mask of the silicon oxide film 102 and the silicon nitride film 103 to form a trench 120.

That is, the silicon substrate 101 formed of single crystal silicon is plasma etched by using an etching gas to form the trench 120 in the silicon substrate 101 as shown in FIG. 1C. At this time, due to presence of the deposits D formed by the first plasma process, etching is slowly performed around the sidewall of the groove portion 110 compared to a central bottom portion of the groove portion 110. That is, since the deposits D function as a protection film, an etching rate of the silicon substrate 101 is decreased around the sidewall of the groove portion 110. As a result, a shoulder portion 120a of the trench 120 shown in FIG. 1C is formed in a round shape having a curved surface.

The second plasma process can be performed under same conditions as those of a trench etching in, for example, a general STI. An etching gas may be sufficient for a processing gas of the second plasma process and, for instance, a halogen containing gas such as a gas containing HBr or $Cl_2$ and a gaseous mixture thereof is preferably used. The processing gas of the second plasma process can be mixed with $O_2$, He, Ar and the like, based on the necessity.

Figure 2:
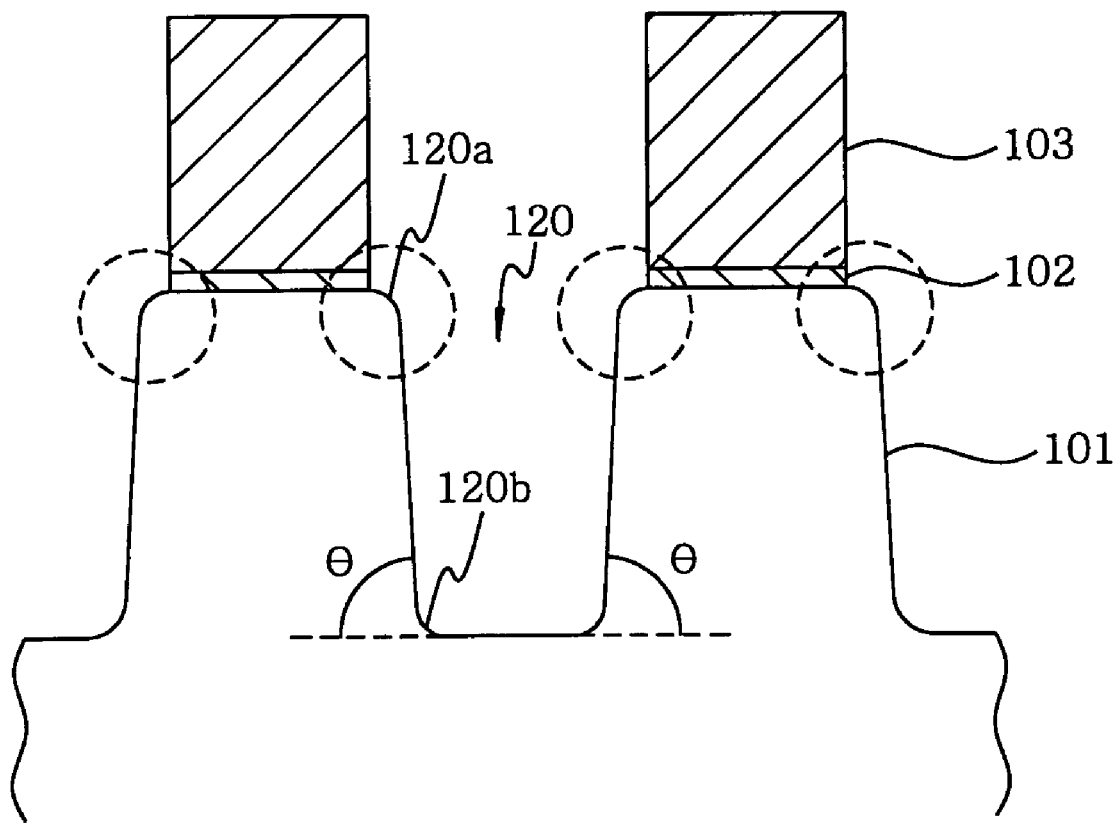
FIG. 2 depicts a cross sectional view showing a schematic configuration of the wafer in which a trench is formed.

FIG. 2 depicts an enlarged cross sectional view showing principal parts of the wafer W after the second plasma process. The trench 120 formed by the second plasma process has a curved surface in the shoulder portion 120a as marked with circular dashed lines in FIG. 2. When an amount of the deposits D formed by the first plasma process, which are shown in FIG. 1B, becomes large, the etching of the silicon substrate 101 is further suppressed in an edge portion (a boundary between the silicon substrate 101, i.e., the etching target layer, and the mask layer) of the bottom portion in the groove portion 110 and, thus, the shoulder portion 120a of the trench 120 is further rounded off.

An amount of deposits D increases in proportion to a processing time of the first plasma process under the same conditions. Thus, the rounding degree (radius of curvature) of the shoulder portion 120a can be controlled by controlling the processing time of the first plasma process. The shoulder portion 120a is preferably controlled to have a radius of curvature of, e.g., about 5 nm~30 nm. From this point of view, the processing time of the first plasma process is not limited particularly, but can be chosen in, for example, a range from 3 seconds to 60 seconds, preferably, a range from 5 seconds to 30 seconds.

Further, as described above, the amount of deposits D can be controlled by varying the composition of the processing gas of the first plasma process, e.g., by mixing the processing gas of the first plasma process with an etching gas. Thus, the rounding degree (radius of curvature) of the shoulder portion 120a can be controlled by selecting components of the processing gas.

In the second plasma process, by controlling the condition such as the temperature, an angle θ of the sidewall of the trench 120 can be varied to form a taper shape, or a corner portion 120b of the bottom of the trench 120 can be rounded off. The angle θ of the sidewall of the trench 120 is preferably in a range from 82° to 88°.

Further, by rounding off the corner portion 120b, a stress after burying an insulating material can be relieved and a leakage current can be reduced, thereby improving reliability of a semiconductor device.

Figure 3:
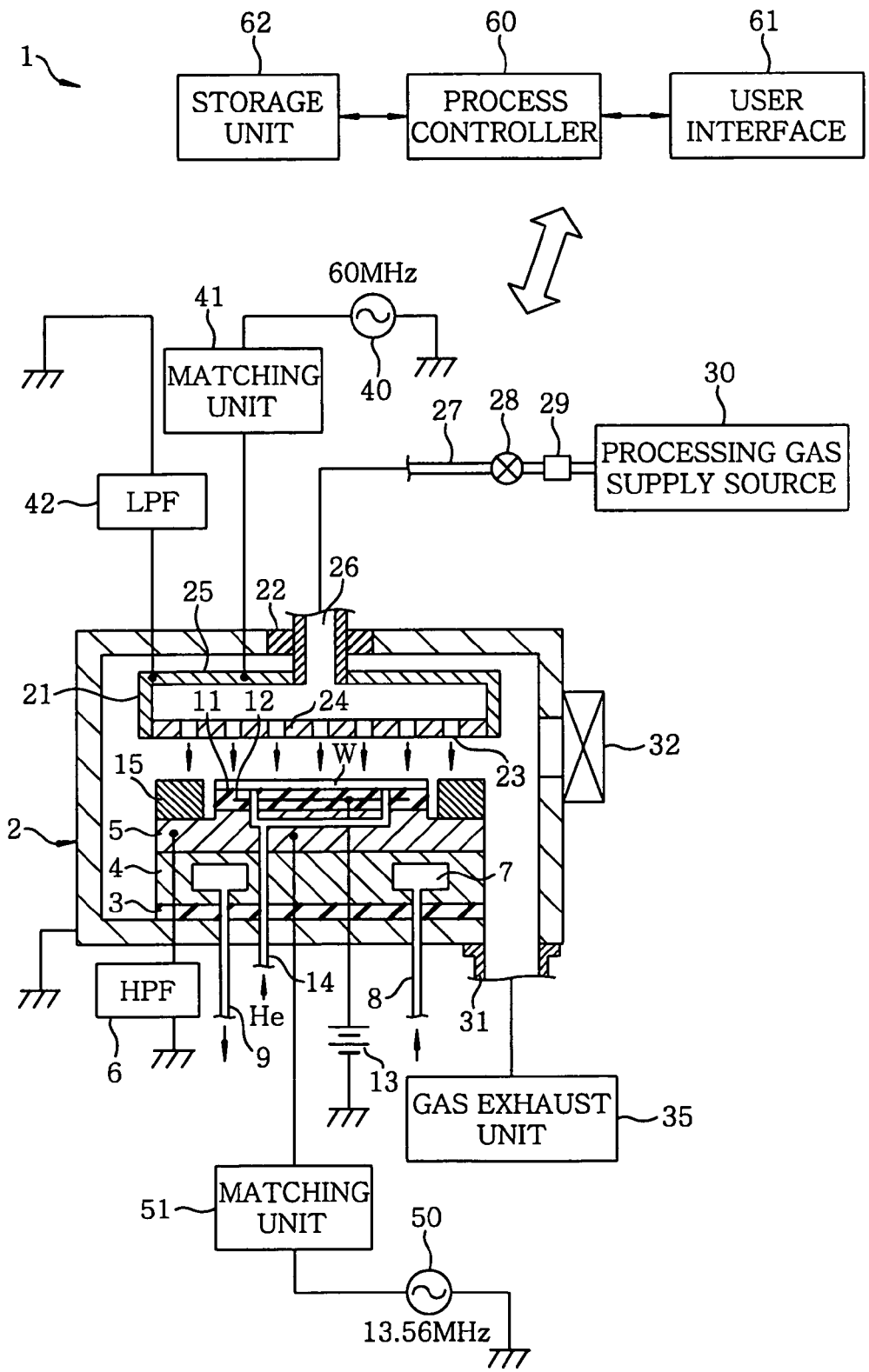
FIG. 3 schematically shows a configuration example of a plasma etching apparatus in accordance with the preferred embodiment of the present invention.

FIG. 3 schematically shows a configuration example of a plasma etching apparatus in accordance with the preferred embodiment of the present invention. A plasma etching apparatus 1 is configured as a capacitively coupled parallel plate type etching apparatus in which an upper and a lower electrode plate are disposed in parallel to each other and high frequency power supplies are connected to the electrode plates, respectively.

The plasma etching apparatus 1 includes a cylindrical chamber 2 formed of aluminum whose surface is, for example, alumite treated (anodic oxidized), and the chamber 2 is grounded. Installed on a susceptor support 4 in the chamber 2 is a susceptor 5 for horizontally mounting thereon an object to be processed, i.e., the wafer W, which is formed of, for example, silicon and has specified films formed thereon. Further, the susceptor 5 also serves as a lower electrode, and a high pass filter (HPF) 6 is connected to the susceptor 5.

A temperature control medium space 7 is provided inside the susceptor support 4, and a temperature control medium is introduced into the temperature control medium space 7 through an inlet line 8 for being circulated therein and then discharged through an exhaust line 9, so that the susceptor 5 can be maintained at a desired temperature.

The susceptor 5 has an upper central portion of disk shape, which protrudes higher than its peripheral portion, and an electrostatic chuck 11 that is shaped substantially identical to the wafer W is mounted on the upper central portion of the susceptor 5. The electrostatic chuck 11 includes an electrode 12 embedded in an insulating member. The wafer W is electrostatically adsorbed onto electrostatic chuck 11 by Coulomb force generated by a DC voltage of, for example, 1.5 kV applied to the electrode 12 from a DC power supply 13 coupled to the electrode 12.

Further, a gas channel 14 for supplying a heat transfer medium, for example, a He gas, to the rear surface of the wafer W, i.e., an object to be etched, under a predetermined pressure (back pressure) is formed through an insulating plate 3, the susceptor support 4, the susceptor 5 and the electrostatic chuck 11. Thus, heat is transferred between the susceptor 5 and the wafer W through the heat transfer medium, so that the wafer W can be maintained at a predetermined temperature.

Moreover, an annular focus ring 15 is disposed on the peripheral portion of the susceptor 5 to surround the wafer W loaded on the electrostatic chuck 11. The focus ring 15 is formed of an insulating material such as ceramic or quartz and functions to improve uniformity of etching.

An upper electrode 21 is disposed above the susceptor 5 to face it in parallel and is supported in an upper portion of the chamber 2 via an insulating member 22. The upper electrode 21 includes an electrode plate 24 that faces the susceptor 5 and an electrode support 25 that serves to support the electrode plate 24 and is made of a conductive material, for example, aluminum whose surface is alumite treated. The electrode plate 24 is formed of, for example, quartz and is provided with a number of injection openings 23. The distance between the susceptor 5 and the upper electrode 21 is adjustable.

A gas inlet port 26 is formed at a center of the electrode support 25 of the upper electrode 21 and coupled to a gas supply line 27. Further, the gas supply line 27 is connected to a processing gas supply source 30 via a valve 28 and a mass flow controller 29, and an etching gas for plasma etching is supplied from the processing gas supply source 30. Though only one processing gas supply source 30 is representatively shown in FIG. 3, the plasma etching apparatus 1 is provided with a plurality of process gas supply sources 30 capable of supplying, for example, a $CHF_3$ gas, an Ar gas, a $Cl_2$ gas, an HBr gas, an $O_2$ gas and the like into the chamber 2 while the flow rates thereof being individually controlled.

A gas exhaust pipe 31 is connected to a bottom portion of the chamber 2 and coupled to a gas exhaust unit 35. The gas exhaust unit 35 includes a vacuum pump such as a turbo molecular pump, and serves to reduce the inner pressure of the chamber 2 down to a predetermined vacuum level, e.g., 1 Pa or less. Further, a gate valve 32 is installed on a sidewall of the chamber 2. The wafer W is transferred between the chamber 2 and an adjacent load-lock chamber (not shown) while the gate valve 32 is opened.

A first high frequency power supply 40 is connected to the upper electrode 21 via a matching unit 41 installed in a feeder line. Further, a low pass filter (LPF) 42 is coupled to the upper electrode 21. The first high frequency power supply 40 has a frequency ranging from 50 to 150 MHz. By applying a high frequency power in such a range, a high-density plasma in a desirable dissociation state can be generated within the chamber 2, which makes it possible to execute a plasma processing under a low pressure. The frequency of the first high frequency power supply 40 preferably ranges from 50 to 80 MHz. Typically, its frequency is chosen to be 60 MHz as illustrated in FIG. 3 or thereabouts.

Further, a second high frequency power supply 50 is connected to the susceptor 5 serving as the lower electrode via a matching unit 51 installed in a feeder line. The second high frequency power supply 50 has a frequency ranging from several hundreds of kHz to less than twenty MHz. By applying a power of a frequency in such a range, a proper ionic action can be facilitated without causing any damage on the wafer W. Typically, the frequency of the second high frequency power supply 50 is chosen to be, for example, 13.56 MHz as shown in FIG. 3 or 800 kHz.

Each component of the plasma etching apparatus 1 is connected to and controlled by a process controller 60 with a CPU. A process manager can operate the plasma etching apparatus 1 by a user interface 61 connected to the process controller 60, and the user interface 61 includes a keyboard for inputting a command, a display for showing an operational status of the plasma etching apparatus 1 and the like.

Moreover, also connected to the process controller 60 is a storage unit 62 for storing therein a recipe including a control program, processing condition data and the like to be used in realizing various processes performed in the plasma etching apparatus 1 under the control of the process controller 60.

Further, when receiving a command from the user interface 61, a necessary recipe is retrieved from the storage unit 62 to be executed on the process controller 60, whereby a desired processing is performed in the plasma etching apparatus 1. Moreover, the recipe including the control program, processing condition data and the like can be retrieved from a computer-readable storage medium such as a CD-ROM, a hard disk, a flexible disk and a nonvolatile memory, or retrieved through an on-line connected via, for example, a dedicated line to another apparatus available all the time.

Hereinafter, there will be explained a process for forming the trench 120 shown in FIG. 2 by etching the wafer W made of single crystal silicon by using the plasma etching apparatus 1 with the above-described configuration.

First, the gate valve 32 is opened and then the wafer W, on which the silicon oxide film 102 and the silicon nitride film 103 are formed, is loaded into the chamber 2 from the load-lock chamber (not shown) to be mounted on the electrostatic chuck 11. A DC voltage is then supplied from the DC power supply 13 to the electrostatic chuck 11, so that the wafer W is electrostatically adsorbed onto the electrostatic chuck 11.

Next, the gate valve 32 is closed and the chamber 2 is evacuated to a predetermined vacuum level by the gas exhaust unit 35. Then, the valve 28 is opened, and a processing gas of the first plasma process, for example, $CHF_3$, is supplied into a hollow portion of the upper electrode 21 from the processing gas supply source 30 via the processing gas supply line 27 and the gas inlet port 26 while its flow rate is controlled to be, for example, 50~300 mL/min, preferably, 150~250 mL/min, by the mass flow controller 29. The processing gas is discharged uniformly towards the wafer W through the injection openings 23 of the electrode plate 24, as indicated by arrows in FIG. 3.

In the first plasma process, while the inner pressure of the chamber 2 is maintained at a predetermined pressure level of, for example, about 1.3~13.3 Pa (10~100 mTorr), preferably, 3.3~10 Pa (25~75 mTorr), a high frequency power of 100~700 W, preferably 200~400 W, is applied to the upper electrode 21 from the first high frequency power supply 40, and another high frequency power of 100~700 W, preferably 200~400 W, is applied to the susceptor 5 serving as the lower electrode from the second high frequency power supply 50. Accordingly, the processing gas is converted into a plasma to form the deposits D in the groove portion 110 of the pattern on the wafer W. The processing time is not limited particularly, but can be properly, for example, 5~30 seconds. Further, as for a temperature as another condition in the chamber, for example, the temperature of the upper electrode 21 can range from 60° C. to 90° C.; the temperature of the sidewall can range from 50° C. to 70° C.; and the temperature of the susceptor 5 (wafer W) can range from 20° C. to 80° C.

Next, in the second plasma process, the trench 120 is formed in the silicon substrate 101. That is, the valve 28 is opened, and an etching gas containing, for example, $Cl_2$ and/or HBr is supplied into a hollow portion of the upper electrode 21 from the processing gas supply source 30 via the processing gas supply line 27 and the gas inlet port 26 while its flow rate ratio is controlled to be a specified value. The etching gas is discharged uniformly towards the wafer W through the injection openings 23 of the electrode plate 24, as indicated by arrows in FIG. 3. The second plasma process can be performed under the processing conditions such as a pressure, a high frequency power and a temperature, which are same as those of the general silicon trench etching.

After the second plasma process is completed, a typical STI process of burying the oxide film and planarizing by CMP is performed to thereby carry out a device isolation.

Hereinafter, results of experiments conducted to confirm the effect of the present invention will be explained.

First, a test sample was fabricated as follows.

The silicon oxide film ($SiO_2$ film) 102 having a thickness of 5.5 nm was formed on the silicon substrate 101 by a thermal oxidation process, and the silicon nitride film ($Si_3N_4$ film) 103 having a thickness of 60 nm was formed thereon by an LPCVD (Low Pressure Chemical Vapor Deposition) method. Further, a bottom anti-reflective coating (BARC) having a thickness of 60 nm was formed thereon and a photoresist layer having a thickness of 166 nm was formed on the top thereof. The photoresist layer was patterned by photolithography, and the $Si_3N_4$ film 103 and the $SiO_2$ film 102 were etched through a mask of the photoresist layer until the silicon substrate 101 was exposed, thereby forming an opening portion, i.e., the groove portion 110. Subsequently, after ashing the photoresist layer and the bottom anti-reflective coating by a plasma of oxygen gas, a native oxide film generated on an exposed surface of the silicon substrate 101 in the groove portion 110 was removed by a plasma process of HBr gas, so that the silicon substrate 101 was exposed on a bottom surface of the groove portion 110.

As for a test sample, the first plasma process and the second plasma process were successively conducted under the following conditions by using the plasma etching apparatus 1 shown in FIG. 3. At that time, a rounding degree (radius of curvature) of the shoulder portion 120a and an angle (taper angle) of the sidewall of the trench 120 were investigated by varying the processing time and temperature of the first plasma process. The results are provided in Table 1.

<Processing Conditions of the First Plasma Process>

Kind and flow rate of processing gas: $CHF_3$, 200 mL/min (sccm)

Pressure in chamber: 6.7 Pa (50 mTorr)

High frequency power: upper electrode 300 W, lower electrode 300 W

Gap between electrodes: 150 mm

Processing time: 5 seconds, 7.5 seconds, or 10 seconds

Backside pressure in center portion/edge portion of wafer W: 1333/1333 Pa (10/10 Torr)

Temperature in chamber: upper electrode 80° C., sidewall 60° C., and wafer W 40° C., 50° C. or 60° C.

<Processing Conditions of the Second Plasma Process>

The second plasma process was conducted under the general etching conditions in STI by using a processing gas containing $Cl_2$ and/or HBr. Further, temperatures in the chamber were same as those of the first plasma process and, namely, the upper electrode was set to have a temperature of 80° C.; the sidewall, 60° C.; and the wafer W, 40° C., 50° C. or 60° C.

TABLE 1

|  | Temperature of lower electrode | Processing time | | |
|---|---|---|---|---|
|  |  | 5 seconds | 7.5 seconds | 10 seconds |
| Depth of trench (nm) | 60° C. | 226 | — | 228 |
|  | 50° C. | — | 228 | — |
|  | 40° C. | 218 | 218 | 221 |
| Radius of curvature (nm) | 60° C. | 11.0 | — | 16.8 |
|  | 50° C. | — | 17.1 | — |
|  | 40° C. | 16.2 | 18.1 | 20.1 |
| Taper angle (θ) | 60° C. | 86.9° | — | 86.7° |
|  | 50° C. | — | 85.1° | — |
|  | 40° C. | 83.8° | 83.8° | 84.2° |

From the Table 1, it is found that a rounding degree (radius of curvature) of the shoulder portion 120a of the trench 120 formed in the silicon substrate 101 highly depends on the temperature and the processing time and can be controlled by varying them. Further, Table 1 shows that the taper angle θ in the trench 120 can be controlled mainly by changing the temperature.

From the results, it is preferable that the rounding degree of the shoulder portion 120a of the trench 120 is controlled by the processing time of the first plasma process and the taper angle θ of the trench 120 is controlled by the temperature. If the rounding degree (radius of curvature) is controlled by the temperature of the first plasma process, when the second plasma process is performed at the same temperature as that of the first plasma process, the taper angle θ can be controlled within a limited range, whereas when the second plasma process is performed at a different temperature, it is required a time for changing the temperature of the lower electrode before the second plasma process is started. On the other hand, if the rounding degree of the shoulder portion 120a of the trench 120 is controlled by the processing time of the first plasma process and the taper angle θ of the trench 120 is controlled by the temperature, it is possible to enhance a throughput and enlarge a control range of the taper angle θ at a constant temperature. Therefore, in accordance with the present invention, the rounding degree of the shoulder portion 120a and the taper angle θ of the trench 120 can be controlled simultaneously while the temperature is maintained constantly in the first and the second plasma process.

While the invention has been shown and described with respect to the preferred embodiment, it will be understood by those skilled in the art that various changes and modifications may be made without departing from the spirit and scope of the invention as defined in the following claims.

For example, though a capacitively coupled parallel plate type etching apparatus, wherein the high frequency powers are respectively applied to the upper electrode 21 and the susceptor 5 serving as the lower electrode, is used in the above preferred embodiment, a plasma etching apparatus, wherein the high frequency power is applied only to the lower electrode, may be employed.

Furthermore, though the preferred embodiment has been described for the trench forming in the STI, the present invention is not limited to the STI and can be applied to any case as long as its object is to round off an upper sidewall portion (shoulder portion) of a recess by etching.

What is claimed is:

1. A plasma etching method for etching an object to be processed, which includes at least an etching target layer and a patterned mask layer formed on the etching target layer, to form a recess corresponding to an opening portion of the patterned mask layer in the etching target layer, comprising:
   a first plasma process of forming deposits on the etching target layer around a boundary between the etching target layer and the mask layer in the opening portion of the patterned mask layer while simultaneously preventing forming deposits on a central bottom surface of the opening portion; and
   a second plasma process of forming the recess by etching the etching target layer after the first plasma process,
   wherein an edge portion of an upper sidewall constituting the recess is rounded off in the second plasma process.

2. The plasma etching method of claim 1, wherein a processing gas of the first plasma process contains hydrofluorocarbon.

3. The plasma etching method of claim 1, wherein a processing gas of the first plasma process contains $CHF_3$, $CH_2F_2$ or $CH_3F$.

4. The plasma etching method of claim 1, wherein a processing gas of the second plasma process is a halogen-based gas.

5. The plasma etching method of claim 4, wherein the halogen-based gas contains at least one of HBr and $Cl_2$.

6. The plasma etching method of claim 1, wherein a processing time of the first plasma process is equal to or greater than 3 seconds and equal to or less than 60 seconds.

7. The plasma etching method of claim 6, wherein a radius of curvature of the edge portion of the upper sidewall constituting the recess is controlled by the processing time of the first plasma process and an angle of the sidewall constituting the recess is controlled by a processing temperature of the second plasma process.

8. The plasma etching method of claim 6, wherein a radius of curvature of the edge portion of the upper sidewall constituting the recess is controlled by mixing a processing gas of the first plasma process containing $CHF_3$, $CH_2F_2$ or $CH_3F$ with an etching gas containing $CF_4$.

9. The plasma etching method of claim 6, which is applied to a trench etching in a shallow trench isolation.

10. The plasma etching method of claim 1, wherein ion components of a processing gas of the first plasma process in a plasma are incident on the object in the first plasma process by a bias voltage generated by applying a high frequency power to a lower electrode mounting thereon the object.

11. A plasma etching method for etching an object to be processed, which includes at least a silicon substrate, a silicon oxide film formed on the silicon substrate and a silicon nitride film formed on the silicon oxide film, wherein the silicon oxide film and the silicon nitride film serve as a mask layer and are patterned to form an opening portion and the object is etched to form a trench corresponding to the opening portion of the patterned mask layer in the silicon substrate, the method comprising:
   a first plasma process of forming deposits on the silicon substrate around a boundary between the silicon substrate and the mask layer in the opening portion of the patterned mask layer by using a plasma of a first processing gas containing C, F and H, wherein a central bottom surface of the opening portion remains substantially free of deposits during the first plasma process; and a second plasma process of forming the trench by etching the silicon substrate by using a plasma of a second processing gas after the first plasma process, wherein an edge portion of an upper sidewall constituting the trench is rounded off in the second plasma process.

12. The plasma etching method of claim 11, wherein ion components of the first processing gas of the first plasma process in the plasma are incident on the object in the first plasma process by a bias voltage generated by applying a high frequency power to a lower electrode mounting thereon the object.

13. A plasma etching method for etching an object to be processed, which includes at least an etching target layer and a patterned mask layer formed on the etching target layer, to form a recess corresponding to an opening portion of the patterned mask layer in the etching target layer, comprising:

a first plasma process of forming deposits on the etching target layer around a boundary between the etching target layer and the mask layer in the opening portion of the patterned mask layer, wherein a central portion of the etching target layer exposed through the opening portion during the first plasma process is maintained substantially free of deposits during the first plasma process; and a second plasma process of forming the recess by etching the etching target layer after the first plasma process, wherein an edge portion of an upper sidewall constituting the recess is rounded off in the second plasma process.

14. The plasma etching method of claim 13, wherein ion components of a processing gas of the first plasma process in a plasma are incident on the object in the first plasma process by a bias voltage generated by applying a high frequency power to a lower electrode mounting thereon the object.

* * * * *